(12) United States Patent
Kim

(10) Patent No.: US 10,964,669 B2
(45) Date of Patent: Mar. 30, 2021

(54) SEMICONDUCTOR PACKAGE INCLUDING STRESS-EQUALIZING CHIP

(71) Applicant: Samsung Electronics Co., Ltd., Suwon-si (KR)

(72) Inventor: Il Ho Kim, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 50 days.

(21) Appl. No.: 16/195,980

(22) Filed: Nov. 20, 2018

(65) Prior Publication Data
US 2020/0020668 A1 Jan. 16, 2020

(30) Foreign Application Priority Data
Jul. 13, 2018 (KR) .......................... 10-2018-0081546

(51) Int. Cl.
H01L 25/065 (2006.01)
H01L 23/31 (2006.01)
H01L 23/00 (2006.01)

(52) U.S. Cl.
CPC ...... *H01L 25/0657* (2013.01); *H01L 23/3128* (2013.01); *H01L 23/562* (2013.01); *H01L 24/32* (2013.01); *H01L 24/33* (2013.01); *H01L 24/48* (2013.01); *H01L 24/73* (2013.01); *H01L 2224/32145* (2013.01); *H01L 2224/32225* (2013.01); *H01L 2224/33181* (2013.01); *H01L 2224/48091* (2013.01); *H01L 2224/48106* (2013.01); *H01L 2224/48145* (2013.01); *H01L 2224/48227* (2013.01); *H01L 2224/73215* (2013.01); *H01L 2224/73265* (2013.01); *H01L 2225/0651* (2013.01); *H01L 2225/06506* (2013.01); *H01L 2225/06562* (2013.01); *H01L 2225/06586* (2013.01); *H01L 2924/1434* (2013.01)

(58) Field of Classification Search
None
See application file for complete search history.

(56) References Cited

U.S. PATENT DOCUMENTS

| | | |
|---|---|---|
| 6,514,794 B2 | 2/2003 | Haba et al. |
| 7,989,943 B2 | 8/2011 | Kim et al. |
| 8,110,439 B2 | 2/2012 | Yu et al. |
| 8,368,198 B2 | 2/2013 | Choi et al. |
| 8,664,757 B2 | 3/2014 | Cho et al. |
| 2005/0067694 A1 | 3/2005 | Pon et al. |

(Continued)

FOREIGN PATENT DOCUMENTS

KR 10-1686553 B1 12/2016

*Primary Examiner* — Alexander G Ghyka
(74) *Attorney, Agent, or Firm* — Muir Patent Law, PLLC

(57) ABSTRACT

A semiconductor package includes a chip stack having a plurality of semiconductor chips vertically stacked on a package substrate. A stress-equalizing chip is disposed on the chip stack, the stress-equalizing chip providing means to reduce the variation in the electrical characteristics of the plurality of semiconductor chips. An encapsulant is disposed on the package substrate and is configured to cover at least a portion of the chip stack. Each of the plurality of semiconductor chips is electrically connected to the package substrate. The stress-equalizing chip is not electrically connected to the substrate or to the plurality of semiconductor chips.

18 Claims, 9 Drawing Sheets

(56) References Cited

U.S. PATENT DOCUMENTS

| | | |
|---|---|---|
| 2010/0055836 A1 | 3/2010 | Yu et al. |
| 2011/0062575 A1* | 3/2011 | Lin .................. H01L 23/13 |
| | | 257/690 |
| 2011/0062596 A1 | 3/2011 | Murayama et al. |
| 2013/0037952 A1 | 2/2013 | Jung |
| 2017/0062337 A1 | 3/2017 | Park et al. |
| 2018/0138101 A1* | 5/2018 | Yu ...................... H01L 24/32 |

* cited by examiner

SEMICONDUCTOR PACKAGE INCLUDING STRESS-EQUALIZING CHIP

CROSS-REFERENCE TO RELATED APPLICATION

This U.S. non-provisional patent application claims priority under 35 U.S.C. § 119 to Korean Patent Application No. 10-2018-0081546, filed on Jul. 13, 2018, in the Korean Intellectual Property Office (KIPO), the disclosure of which is incorporated herein by reference in its entirety.

BACKGROUND

1. Field

Packages consistent with example embodiments relate to a multi-chip semiconductor package including a stress-equalizing chip on a chip stack.

2. Description of Related Art

A multi-chip semiconductor package has advantages in reducing weight, thickness and size of electronic apparatuses, resulting in miniaturization of semiconductor devices. A multi-chip semiconductor package has a structure in which a plurality of semiconductor chips are stacked. The structure in which the plurality of semiconductor chips are stacked is subjected to different amounts of stress according to stacked positions of the semiconductor chips. A distribution of electrical characteristics of the plurality of semiconductor chips is increased due to occurrence of stress singularity. Certain stresses may lead to the piezoelectric effect, where electrical characteristics of circuits are changed as a result of physical stress on the semiconductor chips.

SUMMARY

Example embodiments are directed to providing a semiconductor package capable of reducing a distribution of certain electrical characteristics that occur from certain stresses, and a method of forming the same.

According to example embodiments, a semiconductor package includes a chip stack having a plurality of semiconductor chips vertically stacked on a package substrate. A stress-equalizing chip is disposed on the chip stack, the stress-equalizing chip providing means to reduce the variation in the electrical characteristics between the plurality of semiconductor chips. An encapsulant is disposed on the package substrate and is configured to cover at least a portion of the chip stack. Each of the plurality of semiconductor chips is electrically connected to the package substrate. The stress-equalizing chip is not electrically connected to the substrate or to the plurality of semiconductor chips.

According to example embodiments, which may include the aforementioned embodiments, a semiconductor package includes a chip stack having a plurality of semiconductor chips on a package substrate. A stress-equalizing chip, which is a dummy chip, is disposed on the chip stack. An encapsulant is disposed on the package substrate and is configured to cover at least a portion of the chip stack. The plurality of semiconductor chips include an uppermost semiconductor chip disposed at an uppermost layer of the chip stack, and a plurality of lower semiconductor chips below the uppermost semiconductor chip. Each semiconductor chip of the plurality of semiconductor chips is separated from an adjacent semiconductor chip by a first vertical distance. The stress-equalizing is separate from the uppermost semiconductor chip by the first vertical distance.

According to example embodiments, a semiconductor package includes a chip stack having a plurality of semiconductor chips offset-stacked on a package substrate. A dummy chip is stacked on the chip stack and offset-aligned with an uppermost semiconductor chip of the plurality of semiconductor chips and has the same width and length as that of each of the plurality of semiconductor chips. An encapsulant is disposed on the package substrate and is configured to cover at least a portion of the chip stack. Each of the plurality of semiconductor chips includes a non-volatile memory, the dummy chip includes a semiconductor substrate, one or more metal layers, and one or more insulating layers configured to reduce the variation in the electrical characteristics between the plurality of semiconductor chips, and the dummy chip is not electrically connected to circuitry of the package substrate.

DETAILED DESCRIPTION

Figure 1:
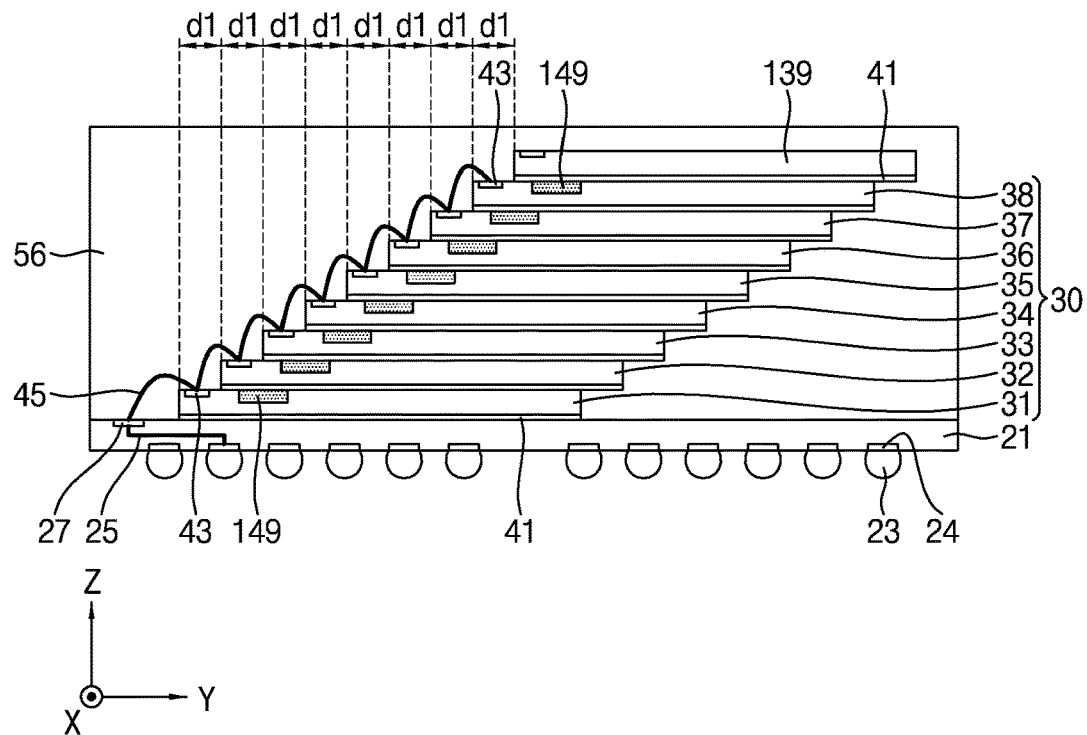
FIGS. 1 to 3 are cross-sectional views for describing semiconductor packages according to example embodiments.
Figure 2:
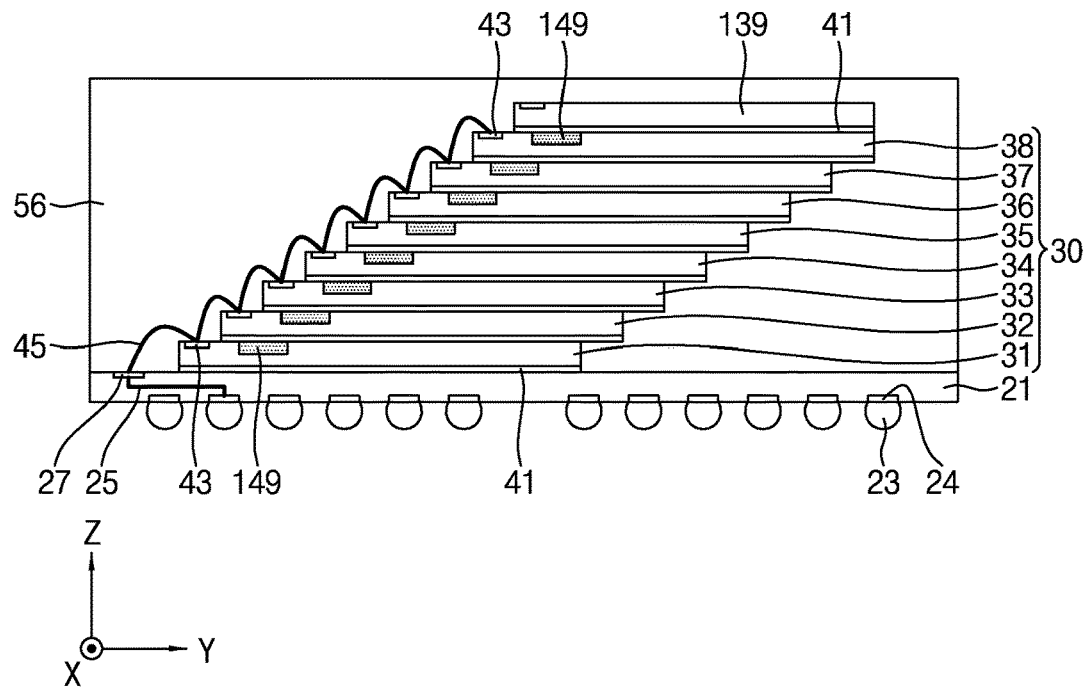
Figure 3:
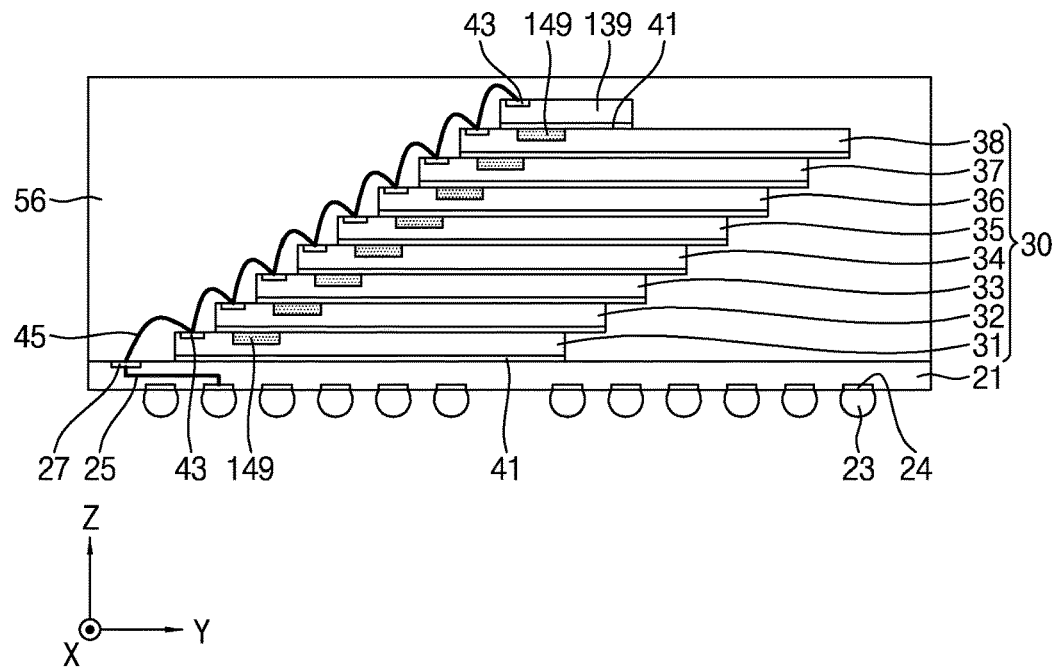

FIGS. 1 to 3 are cross-sectional views for describing semiconductor packages according to example embodiments.

Referring to FIG. 1, a semiconductor package according to an example embodiment of the inventive concept may include a substrate 21, a plurality of protruding electrodes 23, a chip stack 30, a plurality of adhesives 41, a plurality of interconnections 45, an encapsulant 56, and a stress-equalizing chip 139. The substrate 21 may include a plurality of external terminals 24, an internal interconnection 25, and at least one internal terminal 27. The chip stack 30 may include a plurality of semiconductor chips 31, 32, 33, 34, 35, 36, 37, and 38. The plurality of semiconductor chips 31, 32, 33, 34, 35, 36, 37, and 38 may include a first semiconductor chip 31, a second semiconductor chip 32, a third semiconductor chip 33, a fourth semiconductor chip 34, a fifth semiconductor chip 35, a sixth semiconductor chip 36, a seventh semiconductor chip 37, and an eighth semiconductor chip 38, which may be vertically stacked on the substrate 21. Each of the plurality of semiconductor chips 31, 32, 33, 34, 35, 36, 37, and 38 may include at least one stress-sensitive region 149 and at least one chip pad 43.

The substrate 21 may include a package substrate, such as a rigid printed circuit board, a flexible printed circuit board, a rigid-flexible printed circuit board, or a combination thereof. The substrate 21 may be a multilayer circuit board. The plurality of external terminals 24 may be disposed on a lower surface of the substrate 21 and the at least one internal terminal 27 may be disposed on an upper surface of the substrate 21. The at least one internal terminal 27 may be electrically connected to one selected from among the plurality of external terminals 24 via the internal interconnection 25 inside the substrate 21. Each of the plurality of protruding electrodes 23 may be formed on each of the plurality of external terminals 24.

The plurality of protruding electrodes 23 may include a solder ball, a conductive bump, a conductive fin, a conductive lead, or a combination thereof. The plurality of external terminals 24, the internal interconnection 25, and the at least one internal terminal 27 may include a conductive material, such as a metal, a metal nitride, a conductive carbon, or a combination thereof. For example, the plurality of external terminals 24, the internal interconnection 25, and the at least one internal terminal 27 may include copper (Cu). The at least one internal terminal 27 may correspond to a bond finger. In an example embodiment, the plurality of external terminals 24 and the plurality of protruding electrodes 23 may be selectively omitted. The substrate 21 may correspond to a main board or an interposer.

Each of the plurality of external terminals 24 and the at least one internal terminal 27 may be a conductive pad formed at a surface of the substrate 21 and having a flat surface, which may be coplanar with the surface of the substrate 21. In addition, the protruding electrodes 23 may be referred to, either by themselves or as combined with a respective external terminal 24, as external terminals or as external package terminals. The internal interconnections 25 may be referred to as internal conductive interconnections, or internal wiring.

As used herein, components described as being "electrically connected" are configured such that an electrical signal can be passed electrically through a component from one component to another. Therefore, a component such as a wire, pad, internal electrical line, transistor, capacitor, etc., physically connected to an electrically insulative component (e.g., a prepreg layer of a printed circuit board, an electrically insulative adhesive connecting two devices, an electrically insulative underfill or mold layer, etc.), and that does not electrically pass a signal through that electrically insulative component, is not electrically connected to that component.

The plurality of semiconductor chips 31, 32, 33, 34, 35, 36, 37, and 38 may include a non-volatile memory, a volatile memory, a microprocessor, an application processor, a controller, an image sensor, or a combination thereof. In an example embodiment, some of the plurality of semiconductor chips 31, 32, 33, 34, 35, 36, 37, and 38 may have different sizes. The semiconductor chips 31, 32, 33, 34, 35, 36, 37, and 38 may each be formed on a die from a wafer, and may include a semiconductor substrate, one or more integrated circuits formed thereon, one or more conductive layers, and one or more insulating layers. Each semiconductor chip 31, 32, 33, 34, 35, 36, 37, and 38 includes external terminals, described as external chip terminals, that electrically connect to other components outside that semiconductor chip and within the semiconductor package, and each semiconductor chip 31, 32, 33, 34, 35, 36, 37, and 38 electrically connects to circuitry of the package substrate 21, and may be electrically connected to a device external to the semiconductor package through the circuitry of the package substrate 21.

The plurality of adhesives 41 (e.g., adhesive layers) may include, for example, a die attach film (DAF). The plurality of adhesives 41 may be respectively attached to lower surfaces of the plurality of semiconductor chips 31, 32, 33, 34, 35, 36, 37, and 38 and the stress-equalizing chip 139. The plurality of adhesives 41 may be attached between the first semiconductor chip 31 and the substrate 21, between the plurality of semiconductor chips 31, 32, 33, 34, 35, 36, 37, and 38, and between the eighth semiconductor chip 38 and the stress-equalizing chip 139. The plurality of adhesives 41 may each have the same thickness (e.g., in the Z-direction), and so chips 31, 32, 33, 34, 35, 36, 37, 38, and 139 may be equally spaced apart from each other vertically (e.g., in the Z-direction). In this manner, each semiconductor chip of the plurality of semiconductor chips 31, 32, 33, 34, 35, 36, 37, and 38 is separated from an adjacent semiconductor chip by a first vertical distance, and the stress-equalizing chip 139 may be separated from the uppermost semiconductor chip 38 by the same first vertical distance.

The at least one chip pad 43 may include a conductive material, such as a metal, a metal nitride, a conductive carbon, or a combination thereof. For example, the at least one chip pad 43 may include Cu, Co, Al, Sn, Ni, Au, Ag, W, WN, Ti, TiN, Ta, TaN, Ru, Pt, or a combination thereof. The at least one chip pad 43 may be electrically connected to active or passive elements included in the plurality of semiconductor chips 31, 32, 33, 34, 35, 36, 37, and 38.

Each of the plurality of interconnections 45 may include a bonding wire, a beam lead (BL), a tape automated bonding (TAB), or a combination thereof. Each of the plurality of interconnections 45 may include, for example, Au, Al, Cu, Ag, or a combination thereof. The plurality of interconnections 45 may contact the at least one internal terminal 27 and the at least one chip pad 43. The term "contact" as used herein refers to a direct physical connection, e.g., touching. The plurality of semiconductor chips 31, 32, 33, 34, 35, 36, 37, and 38 may be electrically connected to the substrate 21 via the plurality of interconnections 45. In an example embodiment, the plurality of interconnections 45 are not electrically connected to the stress-equalizing chip 139. The plurality of interconnections 45 may be insulated from the stress-equalizing chip 139. In certain embodiments, the stress-equalizing chip 139 is not electrically connected to the substrate 21 or the plurality of semiconductor chips 31, 32, 33, 34, 35, 36, 37, and 38. The stress-equalizing chip 139 may be electrically insulated from the substrate 21 and the plurality of semiconductor chips 31, 32, 33, 34, 35, 36, 37, and 38, and thus in some embodiments does not communicate with other components within the semiconductor package or external to the semiconductor package.

The encapsulant 56 may include an epoxy molding compound (EMC). The encapsulant 56 may cover at least a portion of the chip stack 30. In an example embodiment, the encapsulant 56 may be formed on the substrate 21 to cover side surfaces and upper portions of the chip stack 30, the stress-equalizing chip 139, and the plurality of interconnections 45. Side surfaces of the encapsulant 56 and the substrate 21 may be substantially coplanar and exposed to an outside of the semiconductor package.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

In an example embodiment, the plurality of semiconductor chips 31, 32, 33, 34, 35, 36, 37, and 38 may be the same type. The plurality of semiconductor chips 31, 32, 33, 34, 35, 36, 37, and 38 may include the same type of memory. For example, each of the plurality of semiconductor chips 31, 32, 33, 34, 35, 36, 37, and 38 may include a non-volatile memory such as a flash memory having substantially the same size and substantially the same storage capacity. Each of the plurality of semiconductor chips 31, 32, 33, 34, 35, 36, 37, and 38 may have substantially the same size. Each of the plurality of semiconductor chips 31, 32, 33, 34, 35, 36, 37, and 38 may have substantially the same lateral width, substantially the same lateral length, and substantially the same thickness. Each of the plurality of semiconductor chips 31, 32, 33, 34, 35, 36, 37, and 38 may include the at least one stress-sensitive region 149 at substantially the same position. The at least one stress-sensitive region 149 may be adjacent to the at least one chip pad 43.

The plurality of semiconductor chips 31, 32, 33, 34, 35, 36, 37, and 38 may be sequentially offset-stacked on the substrate 21. The first semiconductor chip 31 may be disposed on the substrate 21. The second semiconductor chip 32 may be offset-arranged on the first semiconductor chip 31. For example, the second semiconductor chip 32 may be offset-arranged on the first semiconductor chip 31 along a length of the first semiconductor chip 31 by a predetermined distance in a lateral direction (e.g., the y-direction). The second semiconductor chip 32 may overlap the at least one stress-sensitive region 149 in the first semiconductor chip 31, from a top-down view. The second semiconductor chip 32 may be disposed to fully cover the at least one stress-sensitive region 149 in the first semiconductor chip 31. The third semiconductor chip 33 to the eighth semiconductor chip 38 may be sequentially offset-arranged on the second semiconductor chip 32, each along a length of the lower semiconductor chip, in the same lateral direction as the second semiconductor chip 32. The chip stack 30 may be described as a cascade stack, or as having a staircase configuration.

The eighth semiconductor chip 38 may be offset-arranged on the seventh semiconductor chip 37. The eighth semiconductor chip 38 may overlap the at least one stress-sensitive region 149 in the seventh semiconductor chip 37, from a top-down view. As shown in FIG. 1, in one embodiment, each semiconductor chip 31-38 in the chip stack 30 may overlap the at least one stress-sensitive region 149 of the semiconductor chip immediately below it, and may overlap the entirety of the at least one stress-sensitive region 149.

The stress-equalizing chip 139 may be disposed on the chip stack 30. The stress-equalizing chip 139 may be offset-arranged on the eighth semiconductor chip 38 in the same lateral direction as the plurality of semiconductor chips 31, 32, 33, 34, 35, 36, 37, and 38. Off-set distances dl between the plurality of semiconductor chips 31, 32, 33, 34, 35, 36, 37, and 38 and the stress-equalizing chip 139 may be substantially the same. For example, an off-set distance dl between the stress-equalizing chip 139 and the eighth semiconductor chip 38 may be substantially the same as the off-set distance dl between the eighth semiconductor chip 38 and the seventh semiconductor chip 37. The stress-equalizing chip 139 may overlap the at least one stress-sensitive region 149 in the eighth semiconductor chip 38. Horizontal widths (e.g., in the x-direction) of the plurality of semiconductor chips 31, 32, 33, 34, 35, 36, 37, and 38 and the stress-equalizing chip 139 may be substantially the same. Lengths (e.g., in the y-direction) of the plurality of semiconductor chips 31, 32, 33, 34, 35, 36, 37, and 38 and the stress-equalizing chip 139 may be substantially the same. Thicknesses or heights (e.g., in the z-direction) of the plurality of semiconductor chips 31, 32, 33, 34, 35, 36, 37, and 38 and the stress-equalizing chip 139 may be substantially the same. The stress-equalizing chip 139 may be a dummy chip having substantially the same size (e.g., length and width) as each of the plurality of semiconductor chips 31, 32, 33, 34, 35, 36, 37, and 38. The stress-equalizing chip 139 may have substantially the same thickness as each of the plurality of semiconductor chips 31, 32, 33, 34, 35, 36, 37, and 38.

Electrical characteristics of the plurality of semiconductor chips 31, 32, 33, 34, 35, 36, 37, and 38 may be changed by stress applied to the plurality of semiconductor chips 31, 32, 33, 34, 35, 36, 37, and 38 due to various pieces of mechanism such as a piezo-resistive effect and the like. When variation in the stress applied to each of the plurality of semiconductor chips 31, 32, 33, 34, 35, 36, 37, and 38 is large, the plurality of respective semiconductor chips 31, 32, 33, 34, 35, 36, 37, and 38 may have different electrical characteristics. When variation between the electrical characteristics of the plurality of semiconductor chips 31, 32, 33, 34, 35, 36, 37, and 38 is large, it is difficult to design and operate a correction circuit for the chip stack 30.

The piezo-resistive effect may include a phenomenon in which an interval between silicon atoms changes and the mobility of electrons changes due to a stress applied to a channel region of a transistor. In an example embodiment, the at least one stress-sensitive region 149 may include a portion sensitive to the piezo-resistive effect. When the plurality of semiconductor chips 31, 32, 33, 34, 35, 36, 37, and 38 are the same type, the at least one stress-sensitive region 149 may be generated at substantially the same position of each of the plurality of semiconductor chips 31, 32, 33, 34, 35, 36, 37, and 38.

The stress-equalizing chip 139 may serve to reduce the variation in the stress applied to each of the plurality of semiconductor chips 31, 32, 33, 34, 35, 36, 37, and 38. The stress-equalizing chip 139 may serve to similarly control a position and a size of a stress singularity occurring in each of the plurality of semiconductor chips 31, 32, 33, 34, 35, 36, 37, and 38. The stress-equalizing chip 139 may serve to equalize the stress applied to the eighth semiconductor chip 38 to be similar to the stress applied to each of the first semiconductor chip 31 to the seventh semiconductor chip 37. The stress-equalizing chip 139, for example based on its makeup, size, and location, may serve as and provide a means to reduce the variation in the electrical characteristics between the plurality of semiconductor chips 31, 32, 33, 34, 35, 36, 37, and 38. The reduction of the variation in the electrical characteristics between the plurality of semiconductor chips 31, 32, 33, 34, 35, 36, 37, and 38 may facilitate the design and operation of the correction circuit for the chip stack 30.

The first semiconductor chip 31 may correspond to a lowermost chip disposed on a lowermost layer of the chip stack 30, and the eighth semiconductor chip 38 may correspond to an uppermost semiconductor chip disposed on an uppermost layer of the chip stack 30. In an example embodiment, the seventh semiconductor chip 37 may correspond to a lower semiconductor chip, and the eighth semiconductor chip 38 may correspond to an upper chip disposed on the lower semiconductor chip. In an example embodiment, the sixth semiconductor chip 36 may correspond to a lower semiconductor chip, the seventh semiconductor chip 37 may correspond to an intermediate semiconductor chip disposed on the lower semiconductor chip, and the eighth semiconductor chip 38 may correspond to an uppermost semiconductor chip disposed on the intermediate semiconductor chip.

In an example embodiment, the stress-equalizing chip 139 may include a semiconductor substrate, a metal plate, a metal nitride plate, a metal oxide plate, an insulating substrate, or a combination or one or more thereof. The stress-equalizing chip 139 may include a semiconductor substrate, one or more metal layers, and one or more insulating layers. The substrate and/or one of more of these layers may be patterned.

In example embodiments, the stress-equalizing chip 139 is a dummy chip, for example, which is not electrically connected to the substrate 21 (e.g., to circuitry of the substrate 21) or to any other chip of the semiconductor package. The stress-equalizing chip may or may not have circuitry (e.g., internal wiring or an integrated circuit) formed therein.

In some embodiments, in order to ensure that each subsequently higher semiconductor chip in the chip stack 30 covers the stress-sensitive region 149 of the lower semiconductor chip, before each semiconductor chip is stacked on a lower chip, the lower semiconductor chip is tested to determine the stress-sensitive region 149. Then, based on the test results, the next semiconductor chip is placed to cover the stress-sensitive region 149 of the lower chip. For the eighth semiconductor chip 38, the same testing can be performed to determine the stress-sensitive region 149 of the eighth semiconductor chip 38, and then the stress-equalizing chip can be placed to cover the determined stress-sensitive region 149. In an exemplary embodiment of the present inventive concept, the stress condition can effectively enhance the carrier mobility. The compressive strain in the PMOS transistor significantly enhances the hole mobility. The tensile strain in the NMOS transistor significantly enhances the electron mobility. The position of the stress-sensitive region 149 may be determined by the designed location and density of the sub-devices such as PMOS transistors.

Referring to FIG. 2, a lateral width (e.g., length in the y-direction) of a stress-equalizing chip 139 may be smaller than a lateral width of each of a plurality of semiconductor chips 31, 32, 33, 34, 35, 36, 37, and 38. One side surface of the stress-equalizing chip 139 may be substantially coplanar (e.g., along the x/z-direction) with one side surface of an eighth semiconductor chip 38.

Referring to FIG. 3, a lateral width (e.g., length in the y-direction) of a stress-equalizing chip 139 may be different from a lateral width of each of a plurality of semiconductor chips 31, 32, 33, 34, 35, 36, 37, and 38. The lateral width of the stress-equalizing chip 139 may be smaller than the lateral width of each of the plurality of semiconductor chips 31, 32, 33, 34, 35, 36, 37, and 38. The stress-equalizing chip 139 may overlap at least one stress-sensitive region 149 inside an eighth semiconductor chip 38.

In one embodiment, a plurality of interconnections 45 may be disposed between the stress-equalizing chip 139, the plurality of semiconductor chips 31, 32, 33, 34, 35, 36, 37, and 38, and a substrate 21. The plurality of interconnections 45 may contact at least one chip pad 43 in the stress-equalizing chip 139. The stress-equalizing chip 139 may be electrically connected to the plurality of semiconductor chips 31, 32, 33, 34, 35, 36, 37, and 38 and the substrate 21 via the plurality of interconnections 45. The stress-equalizing chip 139 may include a different type of chip from the plurality of semiconductor chips 31, 32, 33, 34, 35, 36, 37, and 38. For example, the plurality of semiconductor chips 31, 32, 33, 34, 35, 36, 37, and 38 may include a non-volatile memory, such as a flash memory or a magnetoresistive random access memory (MRAM), or a volatile memory such as a dynamic random access memory (DRAM). The stress-equalizing chip 139 may include a logic chip, such as a controller, a microprocessor, or an application processor.

Figure 4:
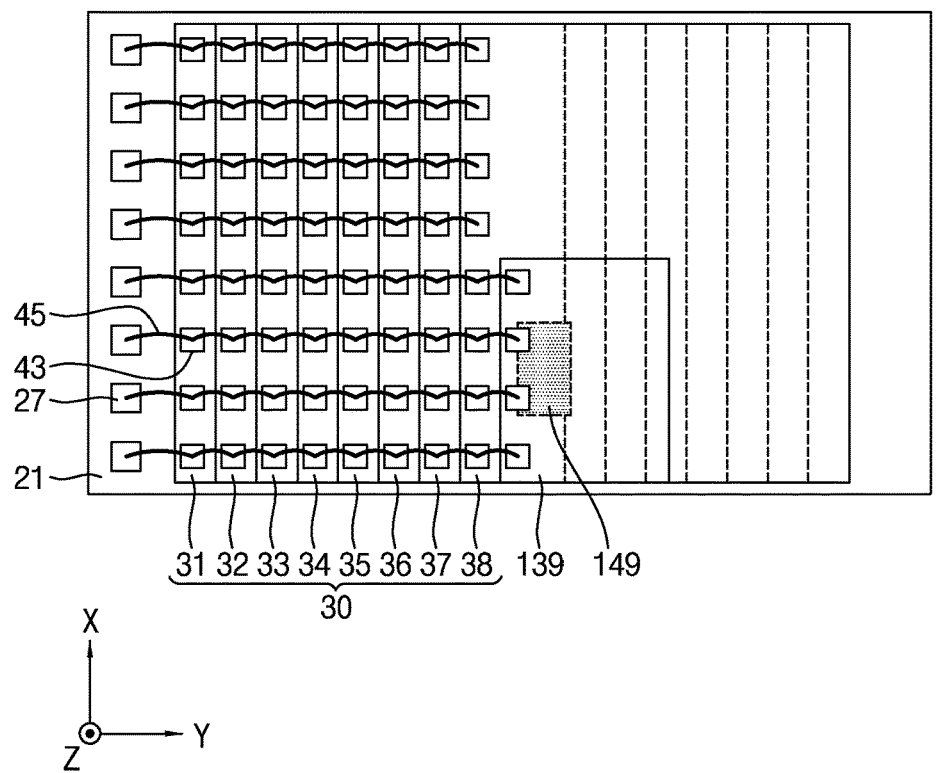
FIGS. 4 and 5 are top views for describing semiconductor packages according to example embodiments.
Figure 5:
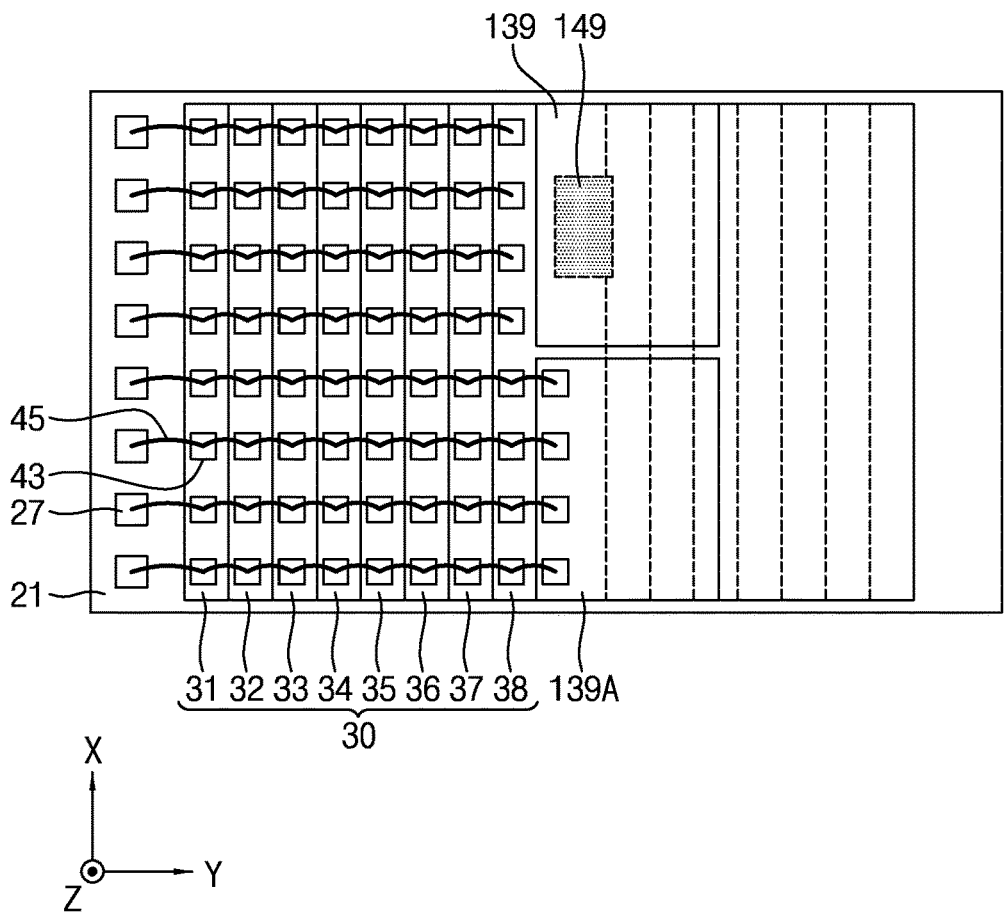

FIGS. 4 and 5 are top views for describing semiconductor packages according to example embodiments.

Referring to FIG. 4, a semiconductor package according to an example embodiment of the inventive concept may include a substrate 21, a chip stack 30, a plurality of interconnections 45, and a stress-equalizing chip 139. The substrate 21 may include a plurality of internal terminals 27. The chip stack 30 may include a plurality of semiconductor chips 31, 32, 33, 34, 35, 36, 37, and 38. Each of the plurality of semiconductor chips 31, 32, 33, 34, 35, 36, 37, and 38 may include at least one stress-sensitive region 149 and a plurality of chip pads 43. The stress-equalizing chip 139 may include a plurality of chip pads 43.

A first semiconductor chip 31 may be disposed on the substrate 21. A second semiconductor chip 32 may be offset-arranged on the first semiconductor chip 31. Similar to the second semiconductor chip 32, a third semiconductor chip 33 to an eighth semiconductor chip 38 may be sequentially offset-arranged on the second semiconductor chip 32. The stress-equalizing chip 139 may be offset-arranged on the eighth semiconductor chip 38 in the same direction as the plurality of semiconductor chips 31, 32, 33, 34, 35, 36, 37, and 38.

A size of the stress-equalizing chip 139 may be smaller than a size of each of the plurality of semiconductor chips 31, 32, 33, 34, 35, 36, 37, and 38. A lateral width (e.g., length in the y-direction) of the stress-equalizing chip 139 may be smaller than a lateral width of each of the plurality of semiconductor chips 31, 32, 33, 34, 35, 36, 37, and 38. A horizontal width (e.g., in the x-direction) of the stress-equalizing chip 139 may be smaller than a horizontal width of each of the plurality of semiconductor chips 31, 32, 33, 34, 35, 36, 37, and 38. The stress-equalizing chip 139 may overlap the at least one stress-sensitive region 149 in the eighth semiconductor chip 38.

The plurality of interconnections 45 may contact the plurality of internal terminals 27 and the plurality of chip pads 43. The plurality of semiconductor chips 31, 32, 33, 34, 35, 36, 37, and 38 and the stress-equalizing chip 139 may be electrically connected to the substrate 21 via the plurality of interconnections 45. The stress-equalizing chip 139 may be electrically connected to the plurality of semiconductor chips 31, 32, 33, 34, 35, 36, 37, and 38 and the substrate 21 via the plurality of interconnections 45.

Referring to FIG. 5, a semiconductor package according to an example embodiment of the inventive concept may include a substrate 21, a chip stack 30, a plurality of interconnections 45, a ninth semiconductor chip 139A, and a stress-equalizing chip 139. The ninth semiconductor chip 139A may include a plurality of chip pads 43.

The ninth semiconductor chip 139A may be offset-arranged on an eighth semiconductor chip 38 in the same direction as the plurality of semiconductor chips 31, 32, 33, 34, 35, 36, 37, and 38. A size of the ninth semiconductor chip 139A may be smaller than a size of each of the plurality of semiconductor chips 31, 32, 33, 34, 35, 36, 37, and 38. A lateral width of the ninth semiconductor chip 139A may be smaller than a lateral width of each of the plurality of semiconductor chips 31, 32, 33, 34, 35, 36, 37, and 38. A horizontal width of the ninth semiconductor chip 139A may be smaller than a horizontal width of each of the plurality of semiconductor chips 31, 32, 33, 34, 35, 36, 37, and 38. The plurality of interconnections 45 may contact a plurality of internal terminals 27 and the plurality of chip pads 43. The ninth semiconductor chip 139A may be electrically connected to the plurality of semiconductor chips 31, 32, 33, 34, 35, 36, 37, and 38 and the substrate 21 via the plurality of interconnections 45. The ninth semiconductor chip 139A may be alternately disposed on at least one stress-sensitive region 149 in the eighth semiconductor chip 38.

The ninth semiconductor chip 139A may include a different type of chip from the plurality of semiconductor chips 31, 32, 33, 34, 35, 36, 37, and 38. For example, the plurality of semiconductor chips 31, 32, 33, 34, 35, 36, 37, and 38 may include a non-volatile memory, such as a flash memory or a MRAM, or a volatile memory such as a DRAM. The ninth semiconductor chip 139A may include a logic chip, such as a controller, a microprocessor, or an application processor.

The stress-equalizing chip 139 may be offset-arranged on the eighth semiconductor chip 38 in the same direction as the plurality of semiconductor chips 31, 32, 33, 34, 35, 36, 37, and 38. The stress-equalizing chip 139 may be disposed adjacent to the ninth semiconductor chip 139A (e.g., in the x-direction). A size of the stress-equalizing chip 139 may be smaller than a size of each of the plurality of semiconductor chips 31, 32, 33, 34, 35, 36, 37, and 38. A lateral width of the stress-equalizing chip 139 may be smaller than a lateral width of each of the plurality of semiconductor chips 31, 32, 33, 34, 35, 36, 37, and 38. A horizontal width of the stress-equalizing chip 139 may be smaller than a horizontal width of each of the plurality of semiconductor chips 31, 32, 33, 34, 35, 36, 37, and 38. The stress-equalizing chip 139 may overlap the at least one stress-sensitive region 149 in the eighth semiconductor chip 38. The plurality of interconnections 45 are not electrically connected to the stress-equalizing chip 139. The stress-equalizing chip 139 may be a dummy chip having a size different from that of each of the plurality of semiconductor chips 31, 32, 33, 34, 35, 36, 37, and 38, and may be electrically insulated from (and thus not electrically connected to) the plurality of semiconductor chips 31, 32, 33, 34, 35, 36, 37, and 38, or the substrate 21.

FIGS. 6 to 17 are cross-sectional views for describing semiconductor packages according to example embodiments.

Figure 6:
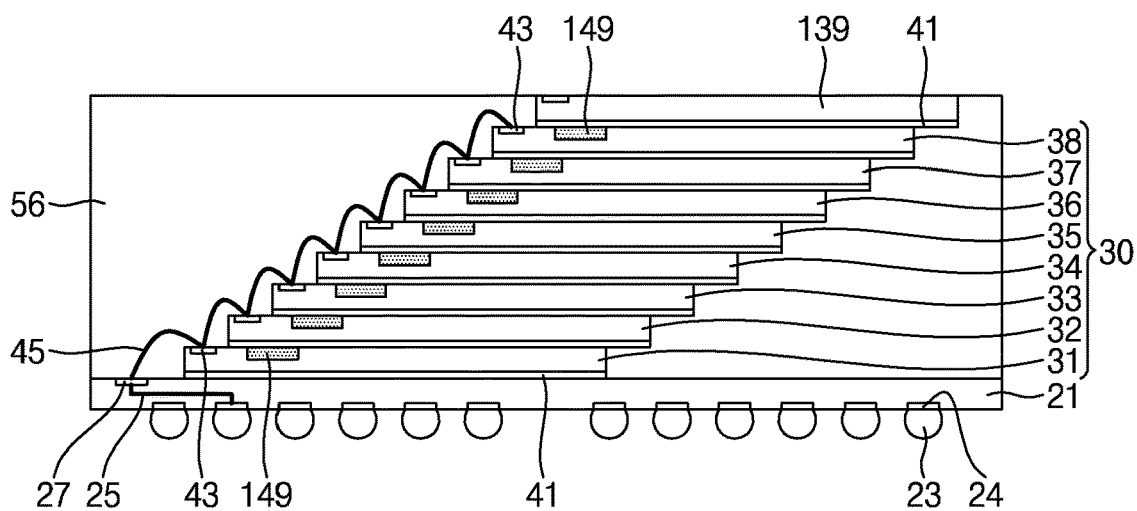
FIGS. 6 to 17 are cross-sectional views for describing semiconductor packages according to example embodiments.

Referring to FIG. 6, an upper surface of a stress-equalizing chip 139 may be exposed to an outside of the semiconductor package. An upper surface of an encapsulant 56 and the upper surface of the stress-equalizing chip 139 are substantially coplanar. The stress-equalizing chip 139 may be a dummy chip having substantially the same size as each of a plurality of semiconductor chips 31, 32, 33, 34, 35, 36, 37, and 38.

Figure 7:
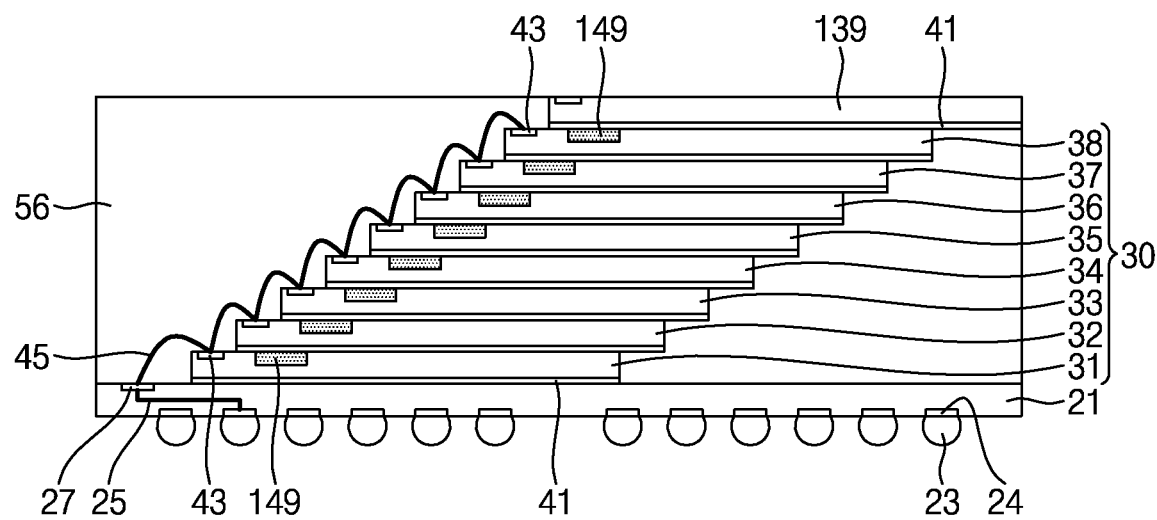

Referring to FIG. 7, an upper surface of the stress-equalizing chip 139 may be exposed an outside of the semiconductor package. An upper surface of an encapsulant 56 and the upper surface of the stress-equalizing chip 139 are substantially coplanar. The stress-equalizing chip 139 may be a dummy chip having a lateral width greater than that of each of a plurality of semiconductor chips 31, 32, 33, 34, 35, 36, 37, and 38. In an example embodiment, at least one side surface of the stress-equalizing chip 139 and at least one side surface of the encapsulant 56 are substantially coplanar.

Figure 8:
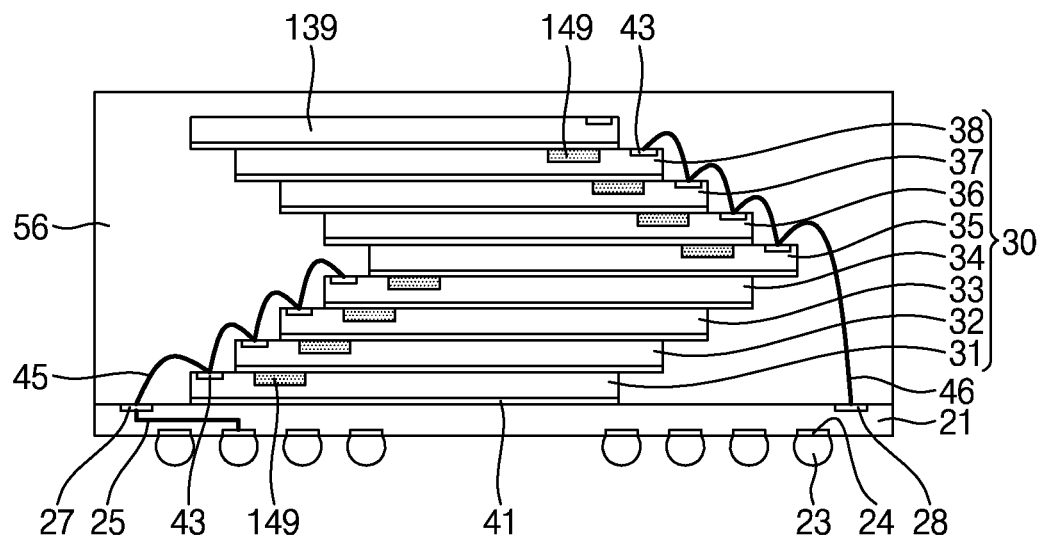

Referring to FIG. 8, a semiconductor package according to an example embodiment of the inventive concept may include a substrate 21, a plurality of protruding electrodes 23, a chip stack 30, a plurality of adhesives 41, a plurality of interconnections 45 and 46, an encapsulant 56, and a stress-equalizing chip 139. The substrate 21 may include a plurality of external terminals 24, an internal interconnection 25, and a plurality of internal terminals 27 and 28.

A first semiconductor chip 31 may be disposed on the substrate 21. A second semiconductor chip 32 may be offset-arranged on the first semiconductor chip 31. For example, the second semiconductor chip 32 may be offset-arranged on the first semiconductor chip 31 by a predetermined distance in a first lateral direction. The second semiconductor chip 32 may overlap at least one stress-sensitive region 149 in the first semiconductor chip 31. Similar to the second semiconductor chip 32, a third semiconductor chip 33 and a fourth semiconductor chip 34 may be sequentially offset-arranged on the second semiconductor chip 32. At least one chip pad 43 of each of the first semiconductor chip 31 to the fourth semiconductor chip 34 may contact a first interconnection 45. One end of the first interconnection 45 may contact a first internal terminal 27.

A fifth semiconductor chip 35 may be offset-arranged on the fourth semiconductor chip 34. For example, the fifth semiconductor chip 35 may be offset-arranged on the fourth semiconductor chip 34 by a predetermined distance in the first lateral direction. The fifth semiconductor chip 35 may overlap at least one stress-sensitive region 149 in the fourth semiconductor chip 34. At least one chip pad 43 in the fifth semiconductor chip 35 may be disposed at a position relatively far from the first interconnection 45.

A sixth semiconductor chip 36 may be offset-arranged on the fifth semiconductor chip 35. For example, the sixth semiconductor chip 36 may be offset-arranged on the fifth semiconductor chip 35 by a predetermined distance in a second lateral direction different from the first lateral direction. The second lateral direction may be opposite to the first lateral direction. The sixth semiconductor chip 36 may overlap the at least one stress-sensitive region 149 in the fifth semiconductor chip 35. Similar to the sixth semiconductor chip 36, a seventh semiconductor chip 37 and an eighth semiconductor chip 38 may be sequentially offset-arranged on the sixth semiconductor chip 36. The at least one chip pad 43 of each of the fifth semiconductor chip 35 to the eighth semiconductor chip 38 may contact a second interconnection 46. One end of the second interconnection 46 may contact a second internal terminal 28.

The stress-equalizing chip 139 may be offset-arranged on the eighth semiconductor chip 38 in the same direction as the sixth semiconductor chip 36 to the eighth semiconductor chip 38. The stress-equalizing chip 139 may overlap the at least one stress-sensitive region 149 in the eighth semiconductor chip 38.

Figure 9:
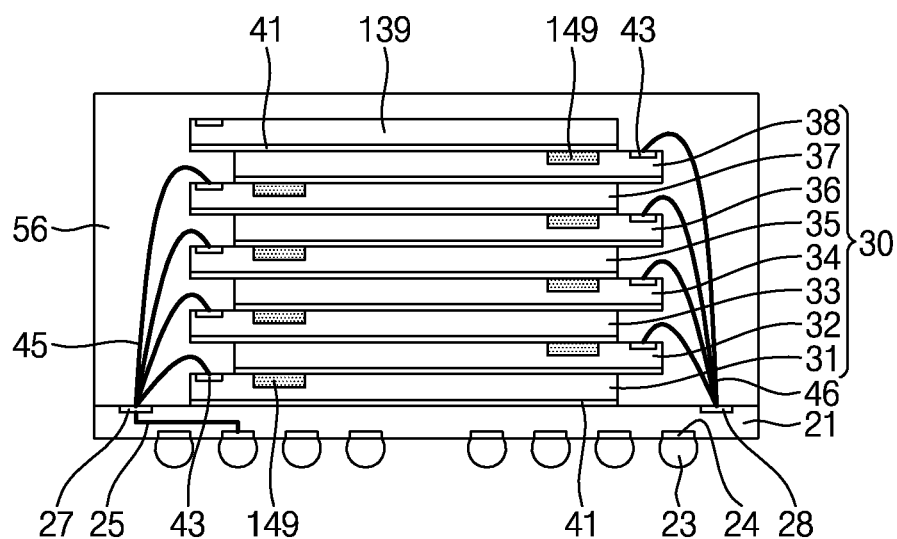

Referring to FIG. 9, a second semiconductor chip 32 may be offset-arranged on a first semiconductor chip 31. For example, the second semiconductor chip 32 may be offset-arranged on the first semiconductor chip 31 by a predetermined distance in a first lateral direction. At least one chip pad 43 in the first semiconductor chip 31 may be disposed relatively close to a first internal terminal 27. At least one chip pad 43 in the second semiconductor chip 32 may be disposed relatively close to a second internal terminal 28.

A third semiconductor chip 33 may be offset-arranged on the second semiconductor chip 32. For example, the third semiconductor chip 33 may be offset-arranged on the second semiconductor chip 32 by a predetermined distance in a second lateral direction different from the first lateral direction. At least one chip pad 43 in the third semiconductor chip 33 may be disposed relatively close to the first internal terminal 27.

A fourth semiconductor chip 34 may be offset-arranged on the third semiconductor chip 33. For example, the fourth semiconductor chip 34 may be offset-arranged on the third semiconductor chip 33 by a predetermined distance in the first lateral direction. At least one chip pad 43 in the fourth semiconductor chip 34 may be disposed relatively close to the second internal terminal 28.

A fifth semiconductor chip 35 may be offset-arranged on the fourth semiconductor chip 34. For example, the fifth semiconductor chip 35 may be offset-arranged on the fourth semiconductor chip 34 by a predetermined distance in the second lateral direction. At least one chip pad 43 in the fifth semiconductor chip 35 may be disposed relatively close to the first internal terminal 27.

A sixth semiconductor chip 36 may be offset-arranged on the fifth semiconductor chip 35. For example, the sixth semiconductor chip 36 may be offset-arranged on the fifth semiconductor chip 35 by a predetermined distance in the first lateral direction. At least one chip pad 43 in the sixth semiconductor chip 36 may be disposed relatively close to the second internal terminal 28.

A seventh semiconductor chip 37 may be offset-arranged on the sixth semiconductor chip 36. For example, the seventh semiconductor chip 37 may be offset-arranged on the sixth semiconductor chip 36 by a predetermined distance in the second lateral direction. At least one chip pad 43 in the seventh semiconductor chip 37 may be disposed relatively close to the first internal terminal 27.

An eighth semiconductor chip 38 may be offset-arranged on the seventh semiconductor chip 37. For example, the eighth semiconductor chip 38 may be offset-arranged on the seventh semiconductor chip 37 by a predetermined distance in the first lateral direction. At least one chip pad 43 in the eighth semiconductor chip 38 may be disposed relatively close to the second internal terminal 28.

The first semiconductor chip 31, the third semiconductor chip 33, the fifth semiconductor chip 35, and the seventh semiconductor chip 37 may be vertically aligned. Side surfaces of the first semiconductor chip 31, the third semiconductor chip 33, the fifth semiconductor chip 35, and the seventh semiconductor chip 37 may be substantially coplanar. A first interconnection 45 may contact the at least one chip pad 43 of each of the first semiconductor chip 31, the third semiconductor chip 33, the fifth semiconductor chip 35, and the seventh semiconductor chip 37. The first semiconductor chip 31, the third semiconductor chip 33, the fifth semiconductor chip 35, and the seventh semiconductor chip 37 may be electrically connected to the first internal terminal 27 in a substrate 21 via the first interconnection 45. The second semiconductor chip 32, the fourth semiconductor chip 34, the sixth semiconductor chip 36, and the eighth semiconductor chip 38 may be vertically aligned. Side surfaces of the second semiconductor chip 32, the fourth semiconductor chip 34, the sixth semiconductor chip 36, and the eighth semiconductor chip 38 may be substantially coplanar. A second interconnection 46 may contact the at least one chip pad 43 of each of the second semiconductor chip 32, the fourth semiconductor chip 34, the sixth semiconductor chip 36, and the eighth semiconductor chip 38. The second semiconductor chip 32, the fourth semiconductor chip 34, the sixth semiconductor chip 36, and the eighth semiconductor chip 38 may be electrically connected to the second internal terminal 28 in the substrate 21 via the second interconnection 46. A chip stack 30 may be interpreted as a zigzag stack.

The stress-equalizing chip 139 may be offset-arranged on the eighth semiconductor chip 38 in the second lateral direction. The stress-equalizing chip 139 may overlap the at least one stress-sensitive region 149 in the eighth semiconductor chip 38. The stress-equalizing chip 139 may be vertically aligned with the first semiconductor chip 31, the third semiconductor chip 33, the fifth semiconductor chip 35, and the seventh semiconductor chip 37. Side surfaces of the stress-equalizing chip 139, the first semiconductor chip 31, the third semiconductor chip 33, the fifth semiconductor chip 35, and the seventh semiconductor chip 37 may be substantially coplanar. Each adhesive 41 may have the same thickness (e.g., in a vertical direction).

Figure 10:
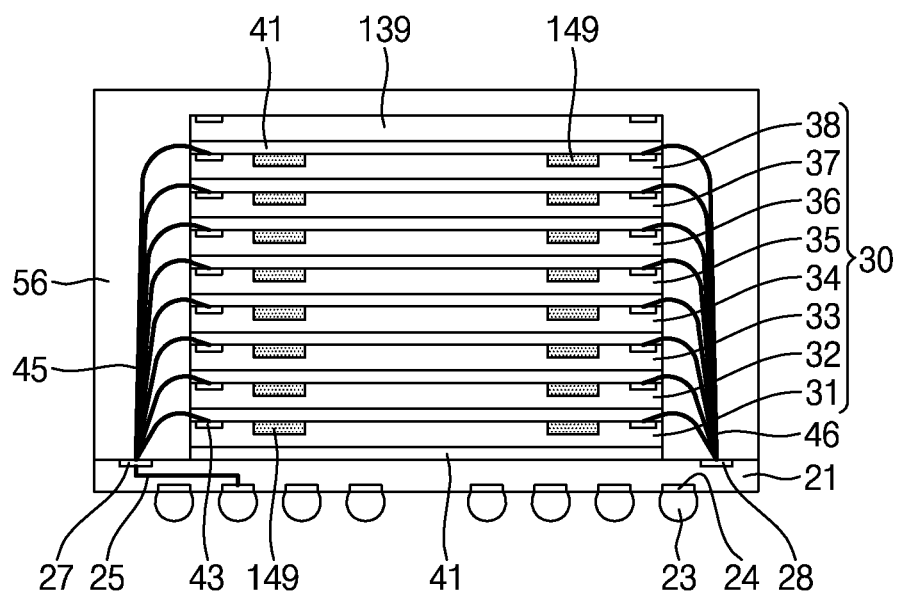

Referring to FIG. 10, a first semiconductor chip 31 to an eighth semiconductor chip 38 may be sequentially and vertically stacked on a substrate 21. A plurality of adhesives 41 may be attached between the substrate 21 and the first semiconductor chip 31 and between the first semiconductor chip 31 to the eighth semiconductor chip 38. Side surfaces of the first semiconductor chip 31 to the eighth semiconductor chip 38 may be substantially coplanar. A plurality of interconnections 45 and 46 may pass through the plurality of adhesives 41 to contact at least one chip pad 43 of each of the first semiconductor chip 31 to the eighth semiconductor chip 38.

A stress-equalizing chip 139 may be disposed on the eighth semiconductor chip 38. The stress-equalizing chip 139 may overlap at least one stress-sensitive region 149 in the eighth semiconductor chip 38. In an example embodiment, the stress-equalizing chip 139 may be vertically aligned with the first semiconductor chip 31 to the eighth semiconductor chip 38. Side surfaces of the stress-equalizing chip 139 and the first semiconductor chip 31 to the eighth semiconductor chip 38 may be substantially coplanar. An encapsulant 56 may be formed to cover side surfaces and upper portions of the chip stack 30, the stress-equalizing chip 139, and the plurality of interconnections 45 and 46.

Figure 11:
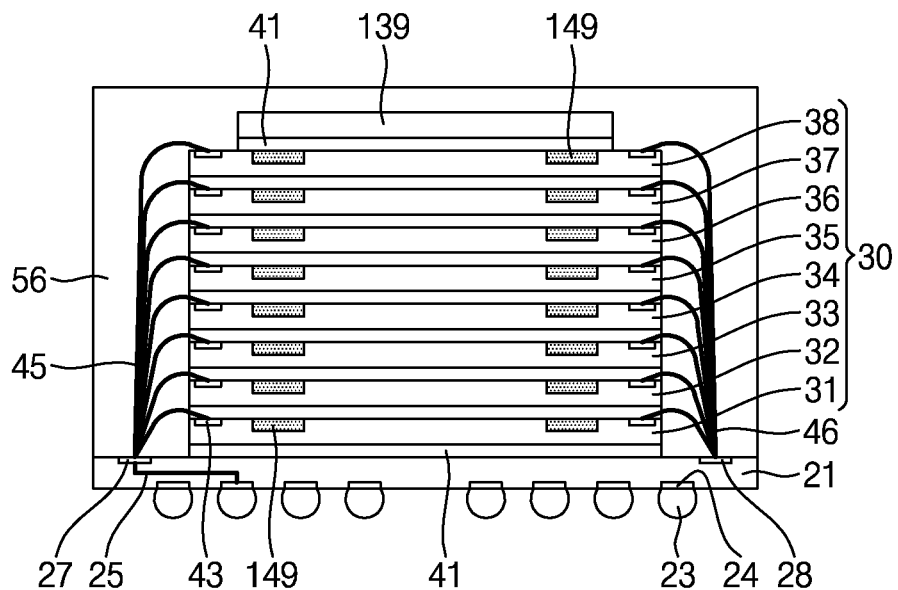

Referring to FIG. 11, a lateral width of a stress-equalizing chip 139 may be smaller than a lateral width of an eighth semiconductor chip 38. The stress-equalizing chip 139 may overlap at least one stress-sensitive region 149 in the eighth semiconductor chip 38.

Figure 12:
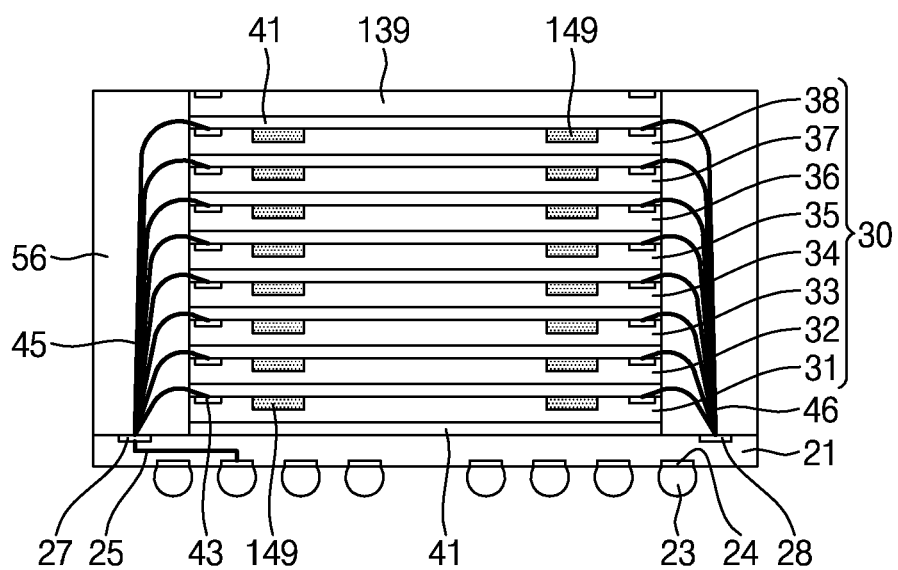

Referring to FIG. 12, an upper surface of a stress-equalizing chip 139 may be exposed to an outside of the semiconductor package. The upper surface of the stress-equalizing chip 139 and an upper surface of an encapsulant 56 may be substantially coplanar.

Figure 13:
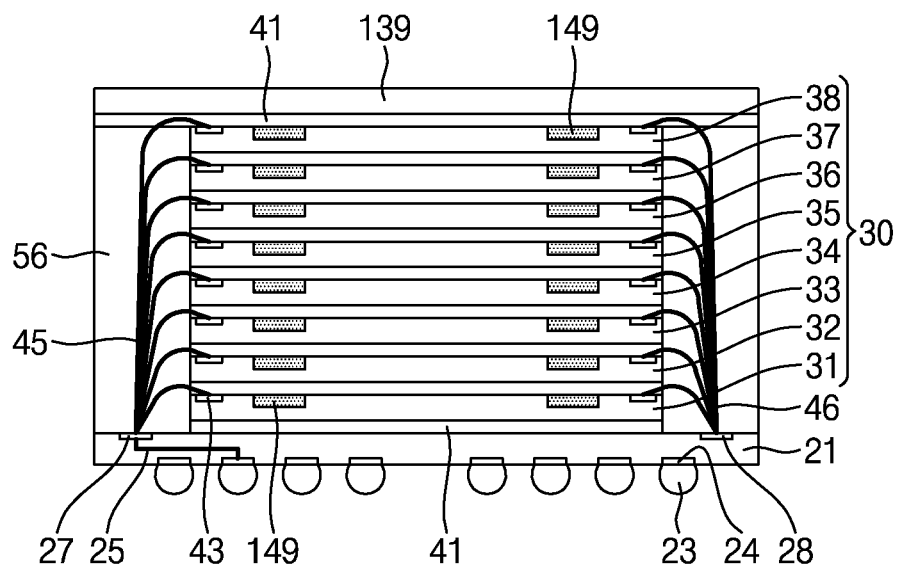

Referring to FIG. 13, a lateral width of a stress-equalizing chip 139 may be greater than a lateral width of an eighth semiconductor chip 38. An upper surface and side surfaces of the stress-equalizing chip 139 may be exposed to an outside of the semiconductor package. Side surfaces of the stress-equalizing chip 139 and an encapsulant 56 may be substantially coplanar.

Figure 14:
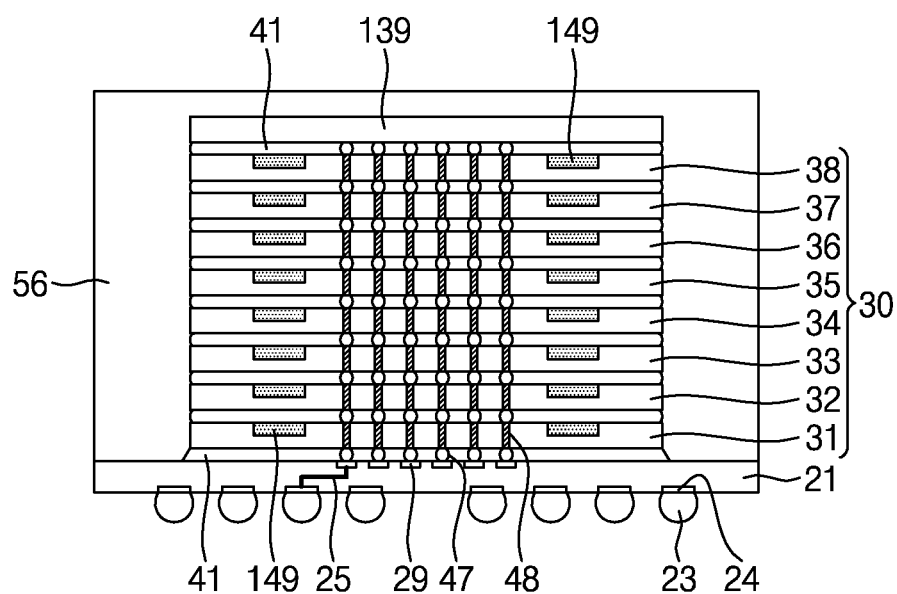

Referring to FIG. 14, a semiconductor package according to an example embodiment of the inventive concept may include a substrate 21, a plurality of protruding electrodes 23, a chip stack 30, a plurality of adhesives 41, a plurality of interconnections 47 and 48, an encapsulant 56, and a stress-equalizing chip 139. The substrate 21 may include a plurality of external terminals 24, an internal interconnection 25, and a plurality of internal terminals 29. The plurality of interconnections 47 and 48 may include a plurality of conductive bumps 47 and a plurality of through-silicon vias (TSVs) 48. The chip stack 30 may include a plurality of semiconductor chips 31, 32, 33, 34, 35, 36, 37, and 38. Each of the plurality of semiconductor chips 31, 32, 33, 34, 35, 36, 37, and 38 may include at least one stress-sensitive region 149.

A first semiconductor chip 31 to an eighth semiconductor chip 38 may be sequentially and vertically stacked on the substrate 21. Side surfaces of the first semiconductor chip 31 to the eighth semiconductor chip 38 may be substantially coplanar. The plurality of adhesives 41 may be attached between the substrate 21 and the first semiconductor chip 31, between the first semiconductor chip 31 to the eighth semiconductor chip 38, and between the eighth semiconductor chip 38 and the stress-equalizing chip 139. The plurality of adhesives 41 may include an under-fill such as a non-conductive resin. Each of the plurality of TSVs 48 may pass through each of the plurality of semiconductor chips 31, 32, 33, 34, 35, 36, 37, and 38. The plurality of conductive bumps 47 may be disposed between the substrate 21 and the first semiconductor chip 31, between the first semiconductor chip 31 to the eighth semiconductor chip 38, and between the eighth semiconductor chip 38 and the stress-equalizing chip 139. The plurality of conductive bumps 47 may pass through the plurality of adhesives 41 to contact the plurality of internal terminals 29 and the plurality of TSV 48. The plurality of semiconductor chips 31, 32, 33, 34, 35, 36, 37, and 38 may be electrically connected to the substrate 21 via the plurality of interconnections 47 and 48.

The stress-equalizing chip 139 may be disposed on the eighth semiconductor chip 38. The stress-equalizing chip 139 may overlap the at least one stress-sensitive region 149 in the eighth semiconductor chip 38. In an example embodiment, the stress-equalizing chip 139 may be vertically aligned with the first semiconductor chip 31 to the eighth semiconductor chip 38. The stress-equalizing chip 139 may have substantially the same lateral width as each of the plurality of semiconductor chips 31, 32, 33, 34, 35, 36, 37, and 38. Side surfaces of the stress-equalizing chip 139 and the first semiconductor chip 31 to the eighth semiconductor chip 38 may be substantially coplanar. The encapsulant 56 may be formed to cover side surfaces and upper portions of the chip stack 30 and the stress-equalizing chip 139.

Figure 15:
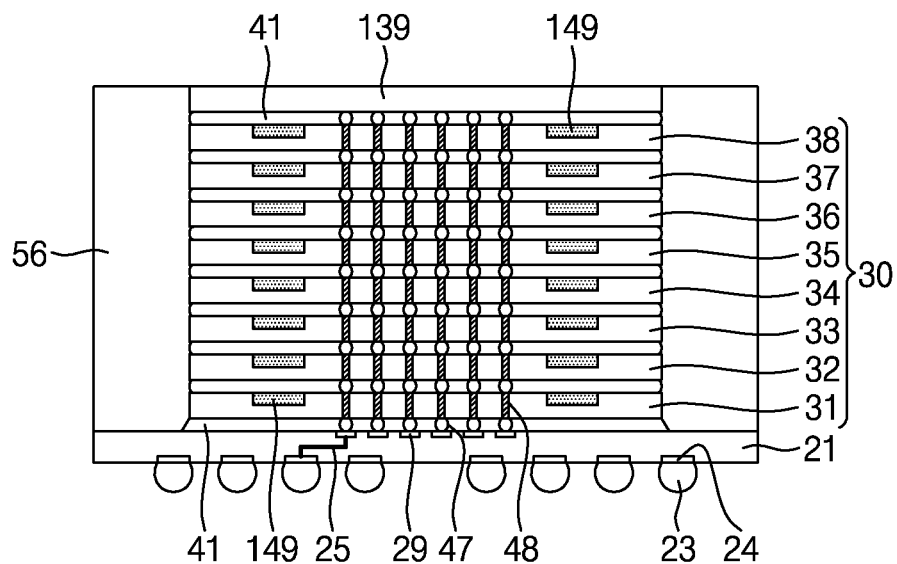

Referring to FIG. 15, an upper surface of a stress-equalizing chip 139 may be exposed to an outside of the semiconductor package. The upper surface of the stress-equalizing chip 139 and an upper surface of an encapsulant 56 may be substantially coplanar.

Figure 16:
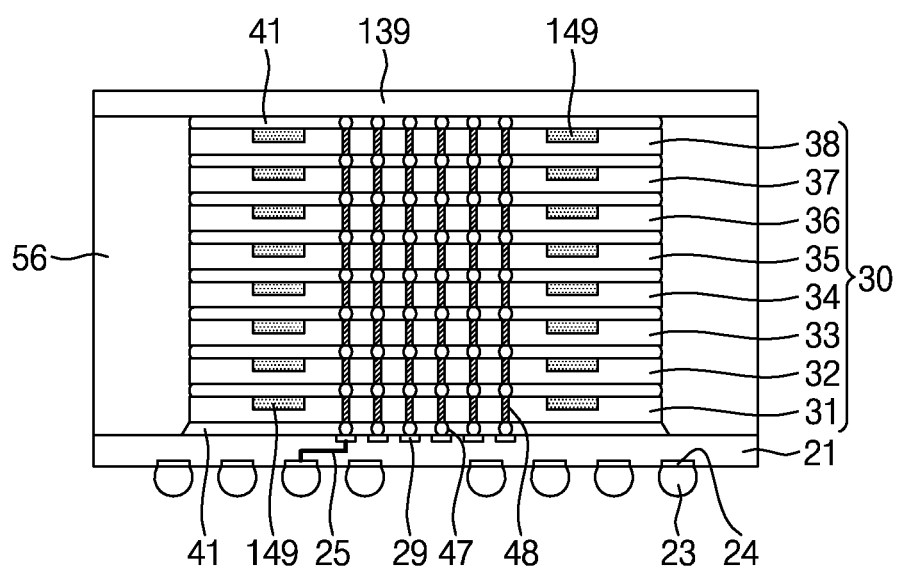

Referring to FIG. 16, a lateral width of a stress-equalizing chip 139 may be greater than a lateral width of an eighth semiconductor chip 38. An upper surface and side surfaces of the stress-equalizing chip 139 may be exposed to an outside of the semiconductor package. The side surfaces of the stress-equalizing chip 139 and side surfaces of an encapsulant 56 may be substantially coplanar.

Figure 17:
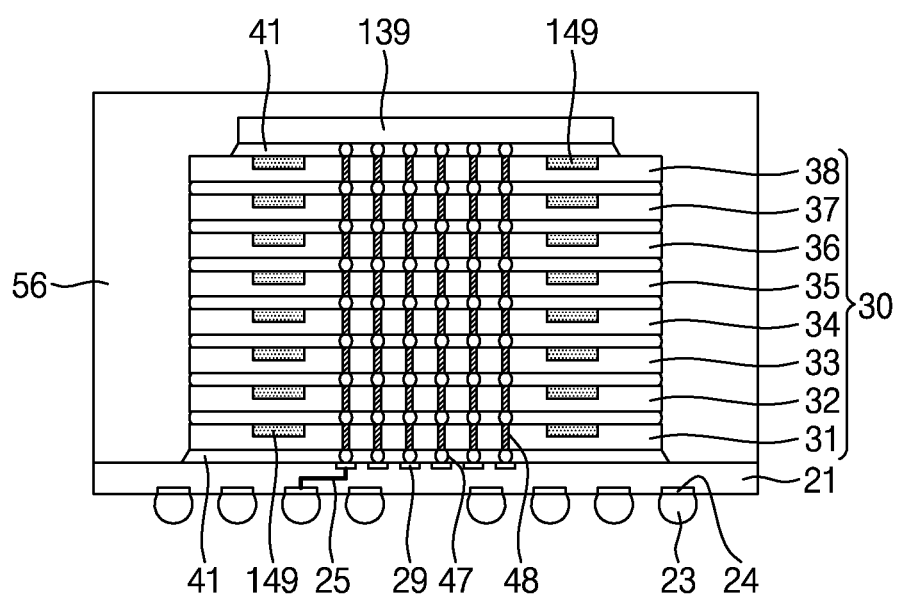

Referring to FIG. 17, a lateral width of a stress-equalizing chip 139 may be smaller than a lateral width of an eighth semiconductor chip 38. The stress-equalizing chip 139 may overlap at least one stress-sensitive region 149 in the eighth semiconductor chip 38.

According to the example embodiments of the inventive concept, a stress-equalizing chip is disposed on a chip stack having a plurality of semiconductor chips. An uppermost semiconductor chip of the plurality of semiconductor chips can include at least one stress-sensitive region. The stress-equalizing chip can overlap the at least one stress-sensitive region. The stress-equalizing chip can serve to reduce variation in a stress applied to each of the plurality of semiconductor chips. Due to the role of the stress-equalizing chip, a distribution of electrical characteristics of the plurality of semiconductor chips can be significantly reduced. Therefore, a semiconductor package having high electrical characteristics can be implemented.

While the embodiments of the inventive concept have been described with reference to the accompanying drawings, it should be understood by those skilled in the art that various modifications may be made without departing from the scope of the inventive concept and without changing essential features thereof. Therefore, the above-described embodiments should be considered in a descriptive sense only and not for purposes of limitation.

What is claimed is:

1. A semiconductor package comprising:
    a chip stack having a plurality of semiconductor chips vertically stacked on a package substrate;
    a stress-equalizing chip disposed on the chip stack the stress-equalizing chip providing means to reduce a variation in electrical characteristics between the plurality of semiconductor chips; and
    an encapsulant disposed on the package substrate and configured to cover at least a portion of the chip stack,
    wherein each of the plurality of semiconductor chips is electrically connected to the package substrate, and the stress-equalizing chip is not electrically connected to the package substrate or the plurality of semiconductor chips,
    wherein each of the plurality of semiconductor chips comprises at least one stress-sensitive region,
    wherein:
        the plurality of semiconductor chips comprises a lower semiconductor chip and an upper semiconductor chip disposed on the lower semiconductor chip, and
        the upper semiconductor chip overlaps the at least one stress-sensitive region of the lower semiconductor chip,
    wherein:
        the plurality of semiconductor chips comprise an uppermost semiconductor chip disposed at an uppermost layer of the chip stack, and
        the stress-equalizing chip overlaps the at least one stress-sensitive region of the uppermost semiconductor chip and is disposed on the uppermost semiconductor chip without any other semiconductor chips formed therebetween, and
    wherein a center of the stress-equalizing chip is not aligned with a center of the uppermost semiconductor chip.

2. The semiconductor package of claim 1, wherein the stress-equalizing chip and each of the plurality of semiconductor chips have the same width in a first direction.

3. The semiconductor package of claim 1, wherein the plurality of semiconductor chips comprises:
    the lower semiconductor chip disposed on the package substrate;
    the upper semiconductor chip, offset-arranged on the lower semiconductor chip along a length of the lower semiconductor chip; and
    the uppermost semiconductor chip offset-arranged on the upper semiconductor chip along a length of the upper semiconductor chip,
    wherein the stress-equalizing chip is offset-arranged on the uppermost semiconductor chip along a length of the uppermost semiconductor chip.

4. The semiconductor package of claim 3, wherein:
    the uppermost semiconductor chip is offset-arranged in the same direction as the upper semiconductor chip is offset-arranged with respect to the lower semiconductor chip; and the stress-equalizing chip is offset-arranged in the same direction as the uppermost semiconductor chip is offset-arranged with respect to the upper semiconductor chip.

5. The semiconductor package of claim 3, wherein:
the uppermost semiconductor chip is offset-arranged in a different direction with respect to the upper semiconductor chip than the upper semiconductor chip is arranged with respect to the lower semiconductor chip; and
the stress-equalizing chip is offset-arranged in a different direction with respect to the uppermost semiconductor chip than the uppermost semiconductor chip is arranged with respect to the upper semiconductor chip.

6. The semiconductor package of claim 3, wherein an off-set distance between the stress-equalizing chip and the uppermost semiconductor chip is the same as an off-set distance between the uppermost semiconductor chip and the upper semiconductor chip.

7. The semiconductor package of claim 3, wherein a width in a first direction of the stress-equalizing chip is smaller than a width in the first direction of each of the lower semiconductor chip, the upper semiconductor chip, and the uppermost semiconductor chip.

8. The semiconductor package of claim 1, wherein a first adhesive is formed below the stress-equalizing chip, and second adhesives are formed below each of the plurality of semiconductor chips, and wherein the first adhesive has the same thickness as the second adhesives.

9. The semiconductor package of claim 1, wherein the encapsulant covers an upper surface and side surfaces of the stress-equalizing chip.

10. The semiconductor package of claim 1, wherein upper surfaces of the encapsulant and the stress-equalizing chip are coplanar and the stress-equalizing chip is exposed to an outside of the semiconductor package.

11. The semiconductor package of claim 1, wherein the plurality of the semiconductor chips and the stress-equalizing chip are arranged in a staircase configuration.

12. The semiconductor package of claim 11, wherein:
the stress-equalizing chip is a dummy chip that does not communicate with the plurality of semiconductor chips or the package substrate, and
the stress-equalizing chip has the same width and length as each semiconductor chip of the plurality of semiconductor chips.

13. A semiconductor package comprising:
a chip stack having a plurality of semiconductor chips on a package substrate;
a stress-equalizing chip disposed on the chip stack, the stress-equalizing chip being a dummy chip; and
an encapsulant disposed on the package substrate and configured to cover at least a portion of the chip stack,
wherein the plurality of semiconductor chips comprise an uppermost semiconductor chip disposed at an uppermost layer of the chip stack and a plurality of lower semiconductor chips below the uppermost semiconductor chip,
wherein each semiconductor chip of the plurality of semiconductor chips is separated from an adjacent semiconductor chip by a first vertical distance,
wherein the stress-equalizing chip is separated from the uppermost semiconductor chip by the first vertical distance,
wherein the stress-equalizing chip is not electrically connected to the package substrate,
wherein the stress-equalizing chip covers a stress-sensitive region of the uppermost semiconductor chip, and
wherein a center of the stress-equalizing chip is not aligned with a center of the uppermost semiconductor chip.

14. The semiconductor package of claim 13, wherein:
each of the plurality of semiconductor chips has the same lateral and horizontal width; and
the stress-equalizing chip has the same lateral width and horizontal width as each of the plurality of semiconductor chips.

15. The semiconductor package of claim 13, wherein the stress-equalizing chip is not electrically connected to the package substrate.

16. The semiconductor package of claim 15, wherein the plurality of semiconductor chips and the stress-equalizing chip are arranged in a staircase configuration.

17. The semiconductor package of claim 13, wherein:
the stress-equalizing chip is offset-aligned with an uppermost semiconductor chip of the plurality of semiconductor chips; and
the dummy chip includes a semiconductor substrate, one or more metal layers, and one or more insulating layers, configured to reduce a variation in electrical characteristics between the plurality of semiconductor chips, and is not electrically connected to circuitry of the package substrate.

18. The semiconductor package of claim 17, wherein the plurality of semiconductor chips and the dummy chip are arranged in a staircase configuration.

* * * * *